US005535132A

United States Patent [19]
Fujita et al.

[11] Patent Number: 5,535,132
[45] Date of Patent: Jul. 9, 1996

[54] VARIABLE SEQUENCE DETERMINING METHOD FOR A DICHOTOMY DETERMINATION GRAPH

[75] Inventors: Masahiro Fujita, Kawasaki, Japan; Yusuke Matsunaga, El-Cerrito, Calif.

[73] Assignee: Fujitsu Limited, Japan

[21] Appl. No.: 836,850

[22] Filed: Feb. 19, 1992

[30] Foreign Application Priority Data

Feb. 20, 1991 [JP] Japan .................................. 3-026388

[51] Int. Cl.$^6$ .................................................. G06F 17/50
[52] U.S. Cl. .................................... 364/489; 364/488
[58] Field of Search .................. 364/488–491, 364/750.5

[56] References Cited

U.S. PATENT DOCUMENTS

| | | | |
|---|---|---|---|
| 4,792,909 | 12/1988 | Serlet | 364/491 |
| 4,815,003 | 3/1989 | Putatunda et al. | 364/491 |
| 4,910,680 | 3/1990 | Hiwatashi | 364/491 |
| 4,918,614 | 4/1990 | Modarres et al. | 364/490 |
| 5,146,583 | 9/1992 | Matsunaka et al. | 395/500 |
| 5,151,867 | 9/1992 | Hooper et al. | 364/489 |
| 5,189,628 | 2/1993 | Olsen et al. | 364/489 |
| 5,189,629 | 2/1993 | Kohnen | 364/489 |
| 5,200,907 | 4/1993 | Tran | 364/490 |
| 5,231,589 | 7/1993 | Itoh et al. | 364/490 |
| 5,237,513 | 8/1993 | Kaplan | 364/490 |
| 5,243,538 | 9/1993 | Okuzawa et al. | 364/489 |
| 5,258,919 | 11/1993 | Yamanouchi et al. | 364/489 |
| 5,282,147 | 1/1994 | Goetz et al. | 364/489 |
| 5,287,289 | 2/1994 | Kageyama et al. | 364/489 |

OTHER PUBLICATIONS

Yang et al., "Optimum and Suboptimum Algorithms for Input Encoding and Its Relationship to Logic Minimization." IEEE Trans. on Computer–Aided Design, vol. 10, No. 1, Jan. 1991, pp. 4–12.

Keutzer, "DAGON: Technology Binding & Local Optimization by DAG Matching," 24th ACM/IEEE Design Automation Conference, 1987, pp. 341–347.

Mathony et al., "CARLOS: An Automated Multilevel Logic Design System for CMOS Semi–Custom Integrated Circuits," IEEE Transactions on CAD, vol. 7, No. 3, Mar. 1988, pp. 346–355.

Paulin et al., "HAL: A Multi–Paradigm Approach to Automatic Data Data Synthesis," 23rd Design Automation Conference, no date, pp. 587–593.

Mano, M. Morris, *Digital Design*, 1984, pp. 72–80; 100–101; 218–229.

*Primary Examiner*—Vincent N. Trans
*Assistant Examiner*—Leigh Marie Garbowski
*Attorney, Agent, or Firm*—Staas & Halsey

[57] ABSTRACT

A variable sequence determining method for determining the optimum sequence of variables in generating a dichotomy determination graph representing a logical function of a two-step logical circuit. A logical expression representing a logical function in a two-step logical circuit is converted to a sum-of-products format for simplification. Then, the number of product terms represented in the positive or negative format in each variable in the logical expression is counted, and a variable having a larger number of said product terms is assigned a higher priority in generating a dichotomy determination graph, thus determining the sequence of variables in generating a dichotomy determination graph for a two-step logical circuit.

8 Claims, 16 Drawing Sheets

|  | $X_1$ | $X_2$ | $X_3$ | $X_4$ |
|---|---|---|---|---|
| $\overline{X_3}X_4$ | — | — | 0 | 1 |
| $X_2X_3\overline{X_4}$ | — | 1 | 1 | 0 |
| $X_1X_4$ | 1 | — | — | 1 |

| NET BEING PROCESS | FANOUT2UP | FANOUT1LIST | ORDER |
|---|---|---|---|
| N9 | NIL | NIL | NIL |
| N7 | NIL | NIL | NIL |
| N5 | NIL | NIL | NIL |
| N1 | NIL | N1 | NIL |
| N2 | NIL | N1, N2 | NIL |
| N3 | N3 | N1, N2 | N3 |
| N8 | N3 | NIL | N3, N1, N2 |
| N6 | N3 | NIL | N3, N1, N2 |
| N4 | N3 | N4 | N3, N1, N2 |
| END | N3 | NIL | N3, N1, N2, N4 |

FIG. 15

| CIRCUIT NAME | NUMBER OF NODE IN DICHOTOMY DETERMINATION GRAPH ||
|---|---|---|
| | ORIGINAL SEQUENCE | SEQUENCE IN PRESENT INVENTION |
| apex1 | 228331 | 4892 |
| apex2 | 20563 | 12530 |
| apex3 | CANNOT GENERATE GRAPH | 5621 |
| seq | 258595 | 7424 |
| planet | 5296 | 2247 |
| sand | 9635 | 2315 |
| styr | 3928 | 2428 |
| scf | 8285 | 4000 |

FIG. 19

VARIABLE SEQUENCE DETERMINING METHOD FOR A DICHOTOMY DETERMINATION GRAPH

BACKGROUND OF THE INVENTION

1. Field of the Invention

The present invention relates to a dichotomy determination graph for representing a logical function, and more specifically to a variable sequence determining method used in generating a dichotomy determination graph for representing a logical function of a two-step logical circuit.

2. Description of the Related Art

Efficient representation of a logical function using a computer is very important in various logical design supporting technologies such as logical collating, logical verification, logical circuit simplification, test circuit generation, etc. Of these techonologies, the logical collating and logical circuit simplification occupy the most important part.

Computer representation of a logical function includes a truth value table, a logical expression in the sum-of-products format, and a dichotomy determination graph. A dichotomy determination graph can represent a large logical function if an appropriate variable sequence is assigned when the graph is generated. The dichotomy determination graph can simplify the representation of a logical function by sharing a sub-graph through fixing for all paths a variable sequence in a determination tree (originally a tree, but can be a shared graph). Additionally, it can be normalized, that is, logical functions can indicate the same result when represented in a dichotomy determination graph if the original logic is the same.

FIG. 1 (PRIOR ART) shows a sample of a dichotomy determination graph. FIG. 1 shows a logical function $X_1 \times X_2 + \overline{X_3}$ ($\overline{X_3}$ is the negative of $X_3$). In FIG. 1, each circle indicates a node corresponding to a variable. 1 corresponds to $X_1$. Each square corresponds to a logical function value. When a square contains the numerical character 1, it indicates that the logical function value is 1. For example, when $X_1$ is 0, an edge with the symbol 0 is searched. When $X_1$ is 1, an edge with the symbol 1 is searched. If a square containing 0 is searched and found finally, the logical function value is 0. The sequence of flexibly arranged variables is fixed for each path, a graph can be shared, and a logical function can be represented as a result. That is, in FIG. 1, the node of variable $X_3$ is pointed to by two edges and is shared.

A logical function can be simplified and represented in a dichotomy determination graph as shown in FIG. 1. However, a graph can be greatly changed depending on the sequence of flexibly arranged variables. This problem is explained in association with FIGS. 2 and 3.

FIGS. 2 and 3 show the same logical function $X_1 \times X_2 + X_3 \times X_4 + X_5 \times X_6$. However, if the sequence of flexibly arranged variables is appropriately fixed as shown in FIG. 2 (PRIOR ART), $X_1$, $X_2$, $X_3$, $X_4$, $X_5$, and $X_6$, the dichotomy determination graph is greatly simplified. By contrast, if the sequence of flexibly arranged variables is fixed as shown in FIG. 3 (PRIOR ART), $X_1$, $X_3$, $X_5$, $X_2$, $X_4$, and $X_6$, the dichotomy determination graph is generated in a much larger size.

Therefore, a dichotomy determination graph greatly depends on the sequence of flexibly arranged variables. In a dichotomy determination graph having a large number of variables, the optimum sequence of variables must be determined by a heuristic approach. A method of determining a comparatively appropriate sequence of variables has been established for a multiple-step circuit. However, the method doesn't work well for a two-step circuit.

SUMMARY OF THE INVENTION

An object of the present invention is to provide a method of determining the optimum sequence of variables in generating a dichotomy determination graph representing a two-step logical circuit.

A feature of the present invention resides in a variable sequence determining method comprising steps of converting a logical expression representing a logical function of the two-step logical circuit to the sum-of-products format for simplification, counting the number of product terms represented as positive or negative in each variable in the logical expression; and determining the sequence of variables by assigning a higher priority to a variable having a larger number of product terms in generating the dichotomy determination graph.

BRIEF DESCRIPTION OF THE DRAWINGS

FIG. 15 shows a view for explaining the content of a queue between the processes shown in FIGS. 7 and 8;

FIG. 19 shows a view for explaining a result of an application of the present invention in a benchmark circuit.

DETAILED DESCRIPTION OF THE PREFERRED EMBODIMENTS

Figure 4:
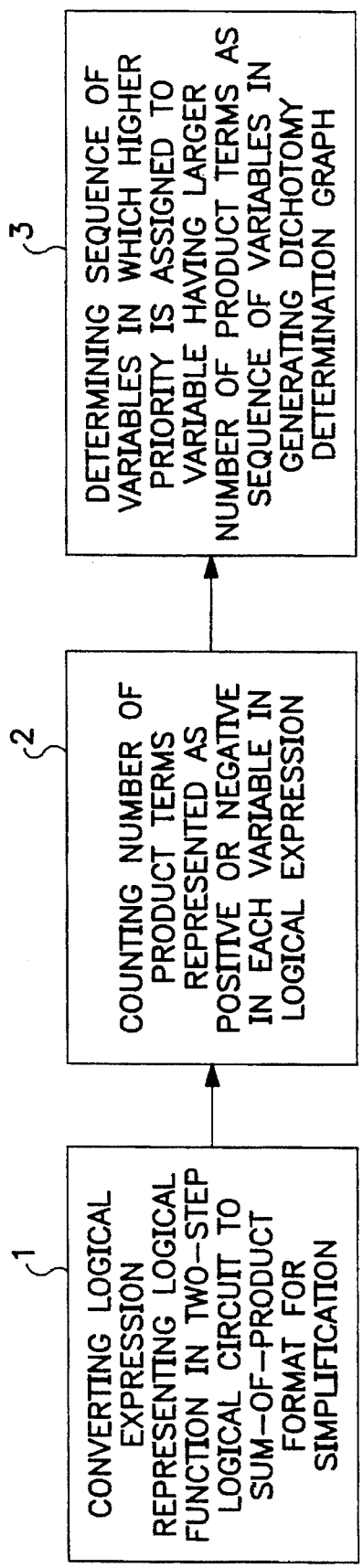
FIG. 4 is a functional block diagram of the present invention.

FIG. 4 is a functional block diagram for explaining the present invention, and shows how to determine the sequence of variables in generating a dichotomy determination graph representing a logical function of a two-step logical circuit.

In FIG. 4, in step 1, a logical expression representing a logical function in a two-step logical circuit is converted to the sum-of-products format for simplification. Then, in step 2, the number of product terms represented in the positive or negative format in each variable in the logical expression (2) is counted. In step 3, a variable having a larger number of said product terms is assigned a higher priority in generating a dichotomy determination graph, thus determining the sequence of variables.

In the present invention, a logical expression of a two-step logical circuit is represented by a "cover" pattern, for example. A "cover" has a matrix pattern having the same number of columns as variables and the same number of rows as product terms in the logical expression in the sum-of-products format. A value of each element of the pattern is indicated as '1' when a variable appears as positive in a product term, as '0' when it appears as negative, and '—' when it does not appear at all. The number of 0s and 1s are counted for each column, and a variable having a larger number is assigned a higher priority, thus determining the sequence of variables in a dichotomy determination graph.

As described above, a dichotomy determination graph representing a logical function of a two-step logical circuit can be generated in a smallest possible size.

Figures 5, 6:
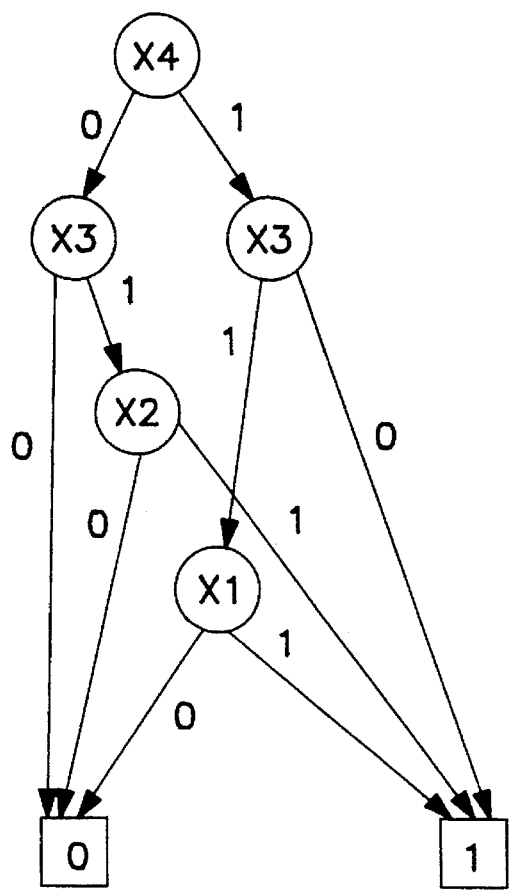
FIG. 5 shows an embodiment of a cover for representing a two-step logical expression.
FIG. 6 shows an embodiment of a dichotomy determination graph using the variable sequence determining method of the present invention.

FIG. 5 shows an embodiment of a cover as a pattern for representing a two-step logical expression. It shows a cover for a logical expression in the sum-of-products format $\overline{X_3} \times X_4 + X_2 \times X_3 \times \overline{X_4} + X_1 \times X_4$. Each column of the cover corresponds to a variable $X_1$, $X_2$, $X_3$, or $X_4$, from left to right. Likewise, each row corresponds to a product term $\overline{X_3} \times X_4$, $X_2 \times X_3 \times \overline{X_4}$, or $X_1 \times X_4$, from top to bottom. Each value in this cover is indicated as '1' when a variable appears as positive in a product term, as '0' when it appears as negative, and as '—' when it does not appear at all.

The number of 0s and 1s are counted for each column representing a variable in the cover shown in FIG. 5, and a variable having a larger number is assigned a higher priority, thus determining the sequence of variables in a dichotomy determination graph. In FIG. 5, the variable $X_4$ has the largest number 3 of 0s and 1s, followed by $X_3$. The number of 0s and 1s in the variables $X_1$ and $X_2$ is 1. The priority between these variables $X_1$ and $X_2$ having the same number of 0s and 1s is described later, but the sequence of these variables is defined as $X_4$, $X_3$, $X_2$, and $X_1$.

Figure 7:
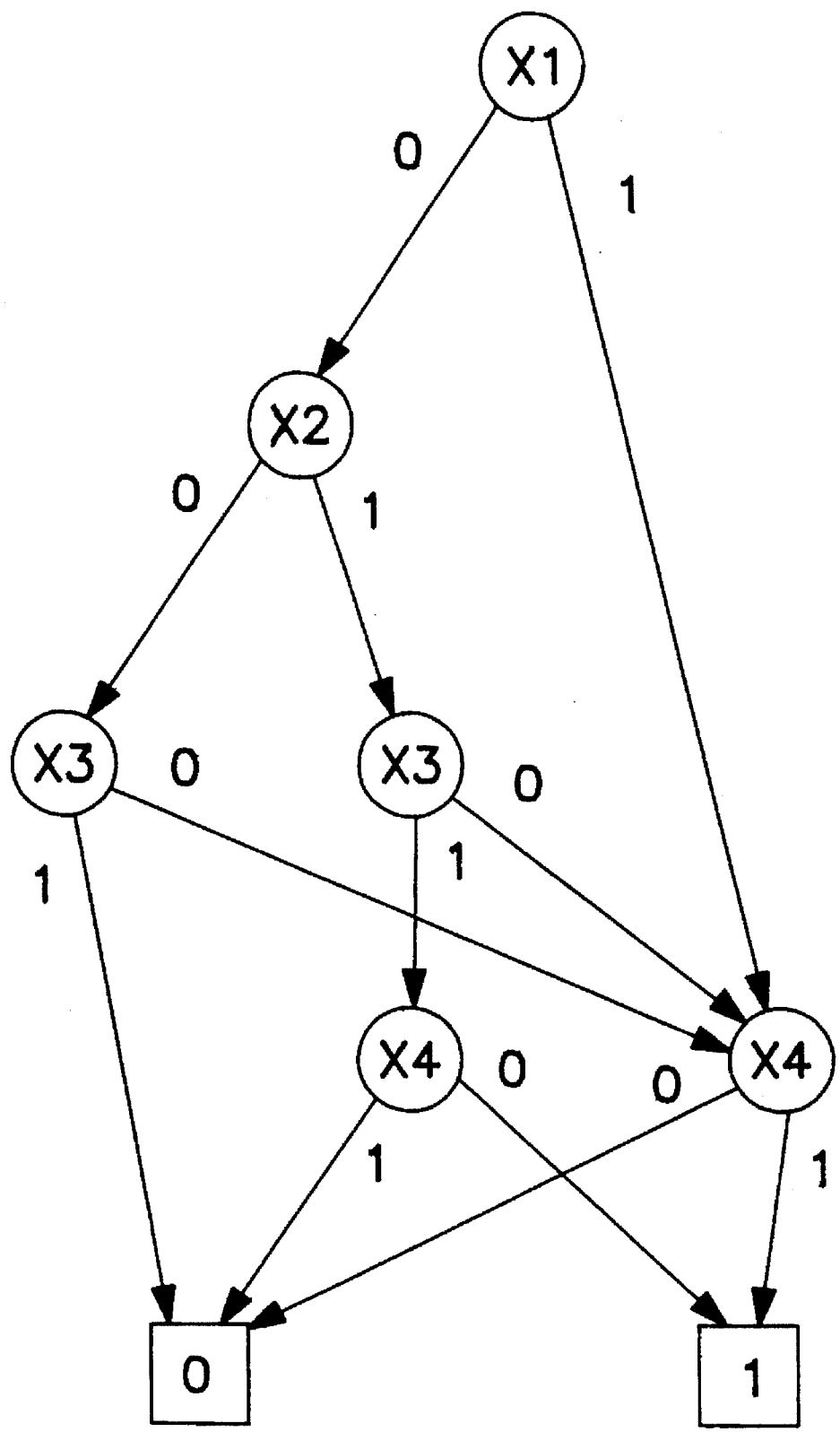
FIG. 7 shows an example of a dichotomy determination graph derived without using the variable sequence determining method of the present invention.

FIG. 6 shows an embodiment of a dichotomy determination graph using the above described sequence of variables. By contrast, FIG. 7 is a dichotomy determination graph using the sequence of variables $X_1$, $X_2$, $X_3$, and $X_4$. In FIG. 6, the number of nodes (written in a circle) of a dichotomy determination graph is 5, while in FIG. 7 the number is 6, thus causing a larger size graph to be generated.

Figure 8:
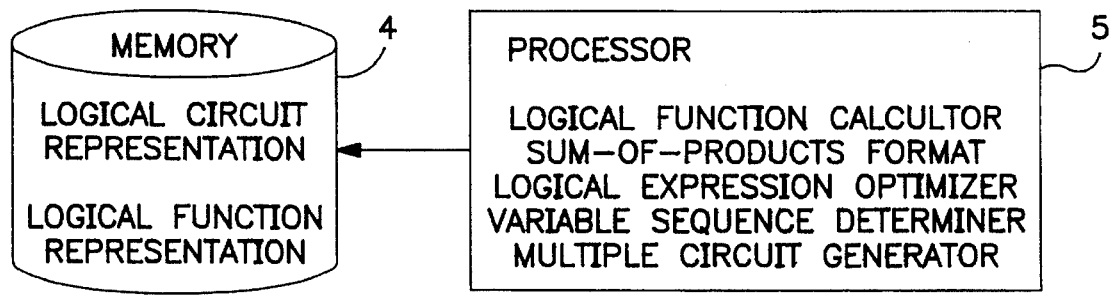
FIG. 8 shows a block diagram for explaining the whole configuration of the computer system using the variable sequence determining method of the present invention.

FIG. 8 is a block diagram showing the configuration of the whole computer system using the variable sequence determining method of the present invention. The system comprises a memory 4 for storing a logical circuit representation and a logical function representation, and a processor 5 comprising a logical function calculator, a sum-of-products format logical expression optimizer, a variable sequence determiner, and a multiple-step circuit generator.

The logical function calculator processes a logical expression for a given circuit specification and converts it to a logical expression in the sum-of-products format. The sum-of-products format logical expression optimizer optimizes a logical expression in the sum-of-products format. The variable sequence determiner determines the sequence of variables, and a dichotomy determination graph is thus generated according to the variable sequence.

Figure 9:
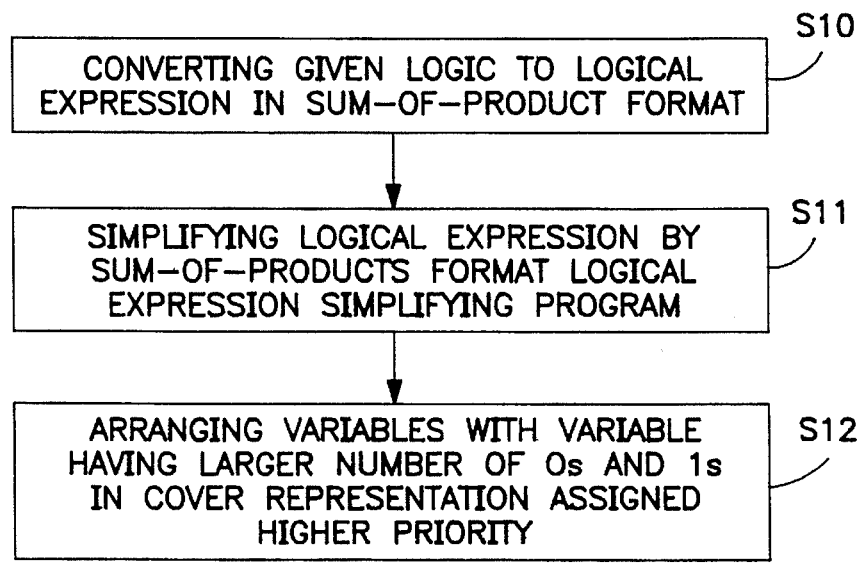
FIG. 9 is a flowchart of an embodiment of a variable sequence determining process.

FIG. 9 is a flowchart of an embodiment for determining the sequence of variables in the present invention. A given logical expression is converted to that in the sum-of-products format in step S 10, simplified by a sum-of-products format logical expression simplifying program, for example, and represented in a cover pattern in step S 11. In step S12, variables are arranged in ascending order starting with the highest priority assigned to a variable having the largest number of 0s and 1s in the cover representation. Then, the process is terminated.

Figure 10:
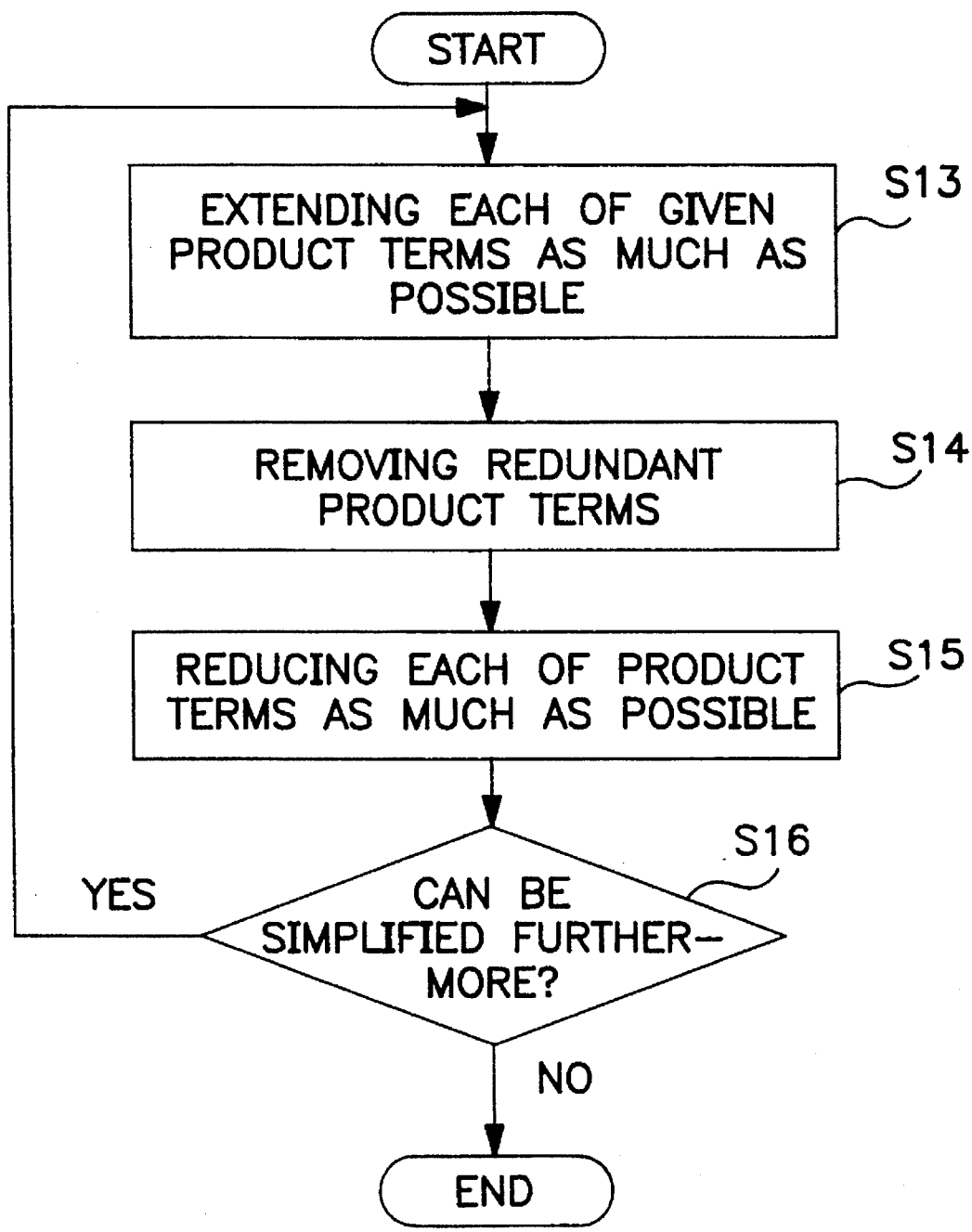
FIG. 10 shows an example of an algorithm for simplifying a logical expression in the sum-of-products format.

FIG. 10 shows an example of an algorithm for simplifying a logical expression in the sum-of-products format. When a process starts, each of the given product terms can be enlarged to the largest extent by replacing the values 0 or 1 assigned in the above described cover with "don't care" in step S 13. Each of the product terms can be reduced to the smallest possible scale by removing redundant product terms in step S 14 and restoring 0 or 1 in place of "don't care" temporarily assigned in the cover in step S 15. Determination is made as to whether or not the logical expression can be further simplified. If yes, the processes following step S 13 are repeated.

Figure 11:
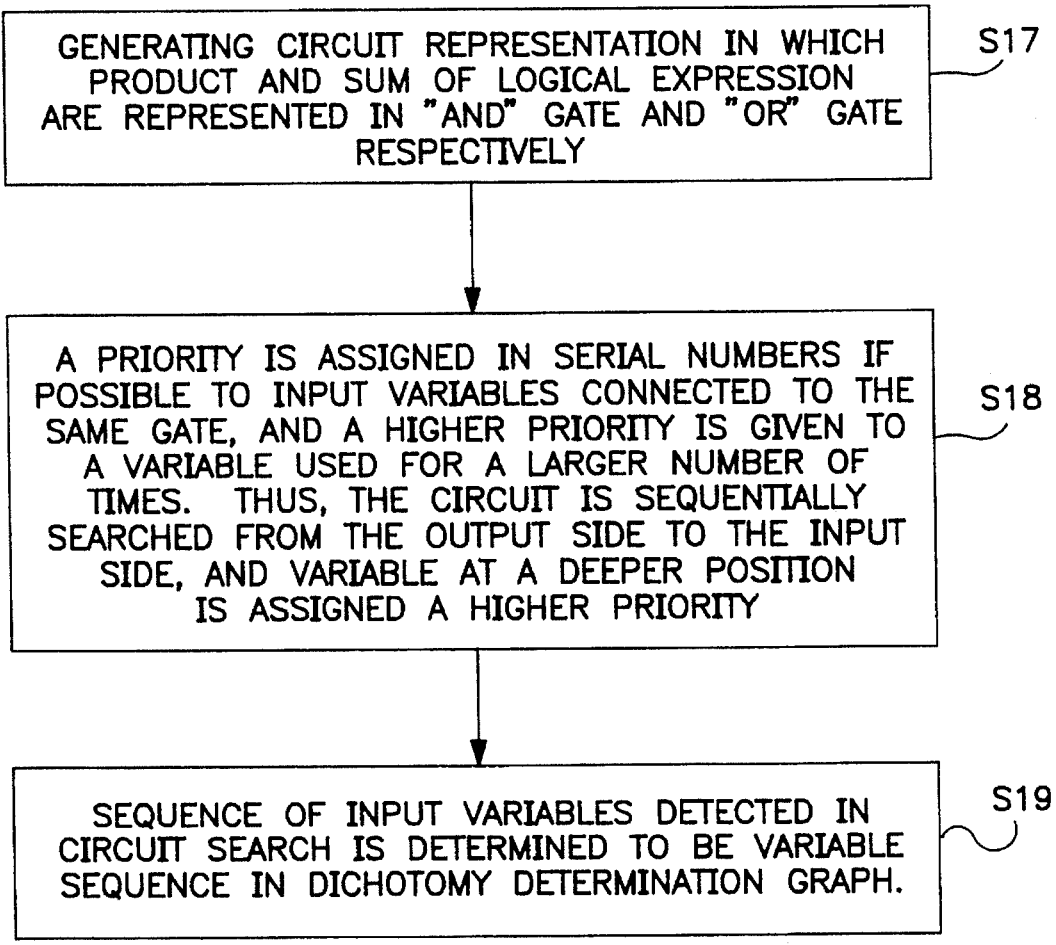
FIG. 11 is a general flowchart of an embodiment for explaining how to determine the sequence of variables having the number of 0 which is the same as that of 1.

FIG. 11 is a general flowchart for explaining how to determine the sequence of variables having the same number of 0s and 1s in a cover. In step S 17, a circuit representation is generated with a product and a sum of a logical expression regarded as an AND gate and an OR gate, respectively. In S 18, a priority is assigned in serial numbers if possible to input variables connected to the same gate, and a higher priority is given to a variable used for a larger number of times. Thus, the circuit is sequentially searched from the output side to the input side and a variable at a deeper position is assigned a higher priority. In step S 19, the sequence of input variables detected in the circuit search is defined as the sequence of variables in a dichotomy determination graph.

Figure 12:
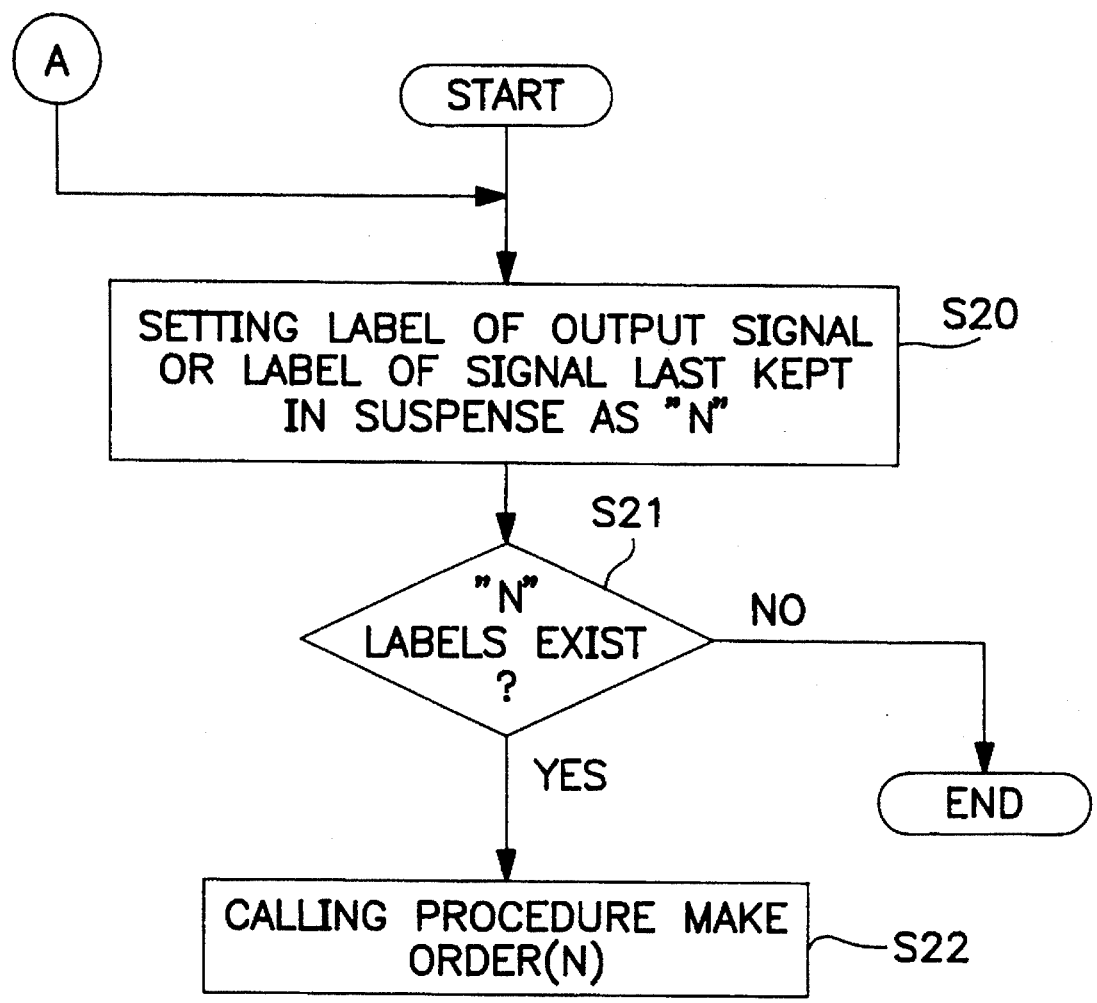
FIG. 12 is a detailed flowchart 1 for explaining how to determine the sequence of variables having the number of 0 which is the same as that of 1.
Figure 13:
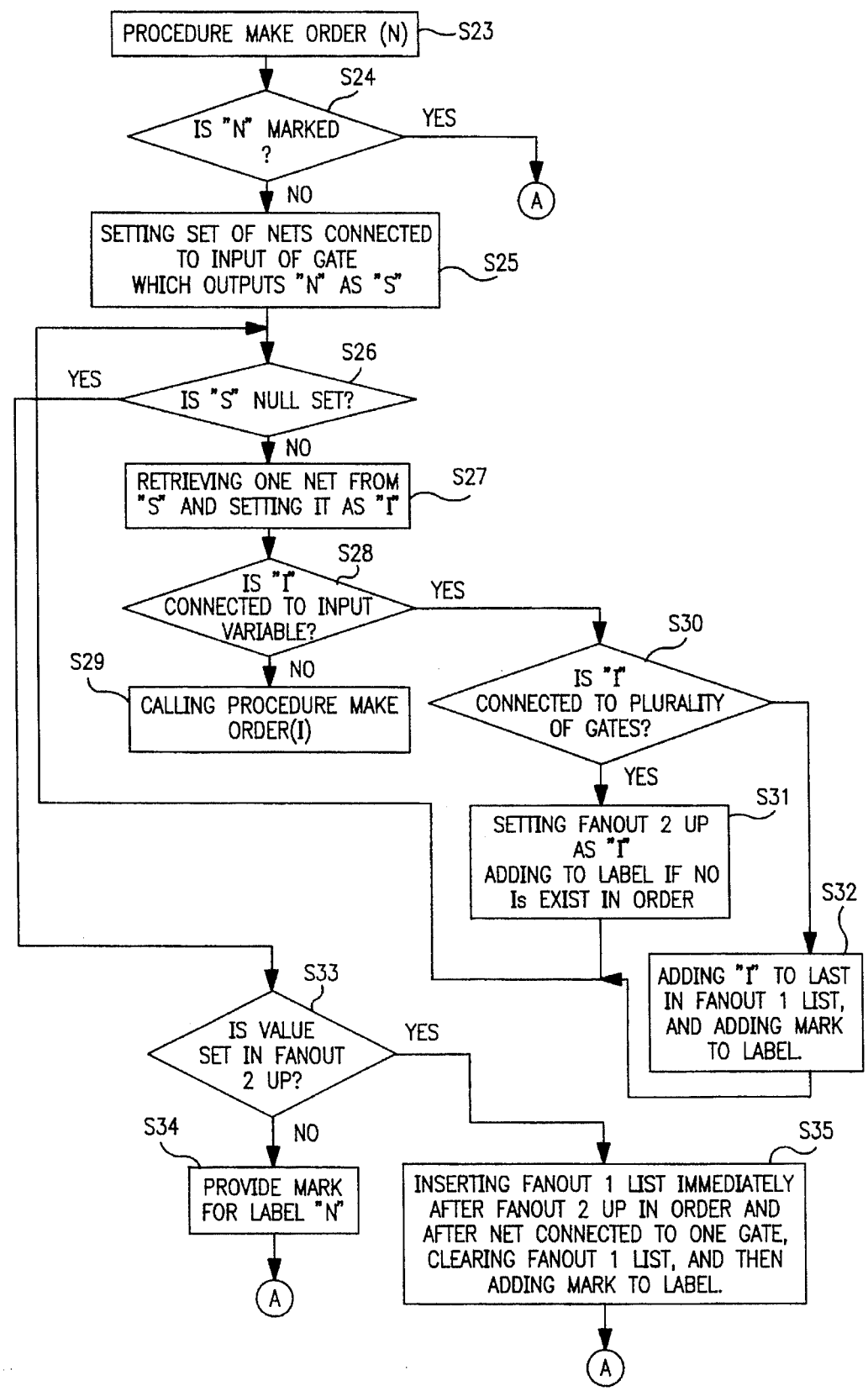
FIG. 13 is a detailed flowchart 2 for explaining how to determine the sequence of variables having the number of 0 which is the same as that of 1.
Figure 14:
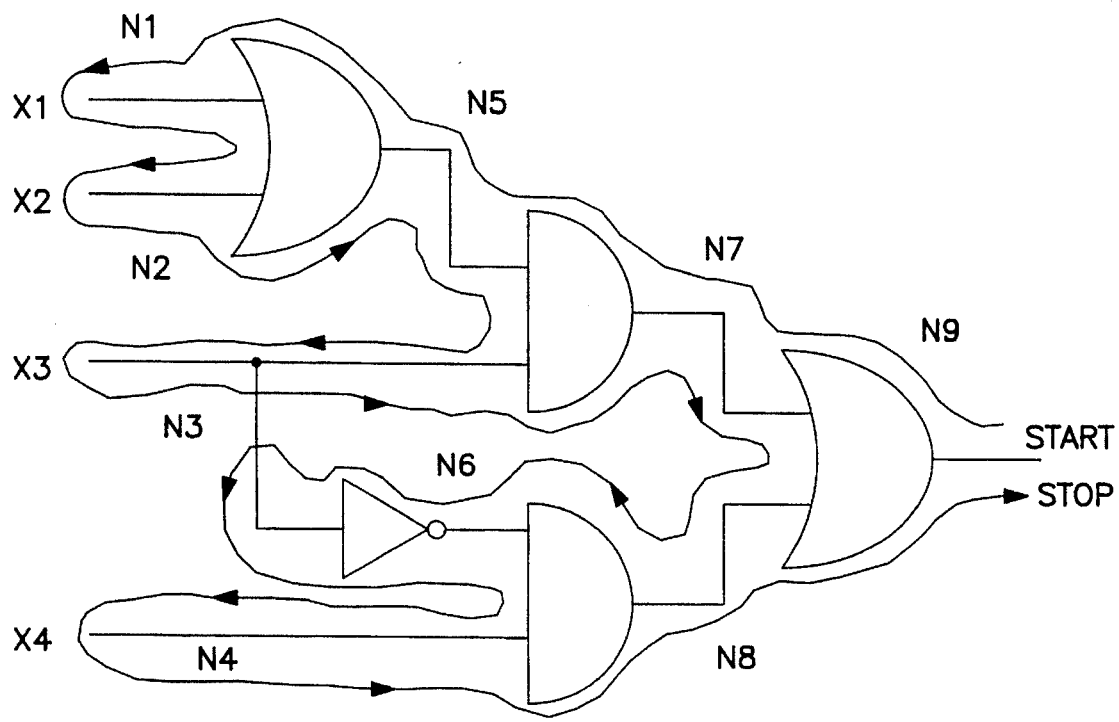
FIG. 14 shows an embodiment for explaining how to search a logical circuit and assign a higher priority to a variable at a deeper position.

FIGS. 12 and 13 are a detailed flowchart for explaining the circuit search process of determining the sequence of variables having the same number of 0s and 1s in a cover. They are explained in further detail using the logical circuit sample shown in FIG. 14. In FIG. 14, a signal at each section of the logical circuit is assigned a label $N_1$–$N_9$, in particular, an input signal corresponding to an input variable is assigned a label $N_1$–$N_4$.

When a process is started in the process flow shown in FIG. 12, a label added to an output signal in the logical circuit or to the signal last kept in suspense is set as "N" (S 20). The first label N is a label added to the output signal in the circuit, and each of the second and following labels is not retrieved in step S 27 as the latest step in FIG. 13, described later.

Then, determination is made as to whether or not a label N exists in step S 21. If yes, a procedure MAKE ORDER (N), in which a signal provided with a label N in step S 22 is processed, is called. If no, the process is terminated.

FIG. 13 is a detailed flowchart of a procedure MAKE ORDER (N) called in step S 22. The flowchart shown in FIG. 13 is described by referring to an example shown in FIG. 14.

(1) In step S 23 as shown in FIG. 13, an output signal having a label $N_9$ shown in FIG. 14 is processed.

(2) In step S 24, determination is made as to whether or not a label $N_9$ was processed first depending on whether or not a mark is added to the $N_9$.

(3) As the label was not processed first, the input $N_7$ and $N_8$ of an OR gate which outputs a label $N_9$ are checked in step S 25.

(4) In this case, labels $N_7$ and $N_8$ exist as input, implying no null set (that is, implying the existence of input) control is passed from S 26 to S 27.

(5) $N_7$ is retrieved as the input on one side and defined as $I=N_7$ in step S 27.

(6) Determination is made as to whether or not $N_7$ is directly connected to an input variable in step S 28.

(7) As $N_7$ indicates NO, control is passed to step S 29 to process a label $N_7$. Performing the process in step S 29 is setting $N_7$ as a label N in step S 23. Then, control is passed to step S 24 with the label N set to $N=I=N_7$.

(8) Control is passed to step S 25 to check the input $N_5$ and $N_3$ of an AND gate which outputs a label $N_7$.

(9) $N_5$ is retrieved as the input on one side and defined as $I=N_5$ through steps S 26 and S 27.

(10) Determination is made as to whether or not $N_5$ is directly connected to an input variable in step S 28.

(11) As $N_5$ indicates NO, control is passed to step S 29 to process a label $N_5$. Performing the process in step S 29 is setting $N_5$ as a label N in step S 23. Then, control is passed to step S 24 with the label N set to $N=I=N_5$.

(12) Since there are no marks added to a label $N_5$, control is passed to step S 25 to check the input $N_1$ and $N_2$ of an OR gate which outputs a label $N_5$.

(13) $N_1$ is retrieved as the input on one side and defined as $I=N_1$ through steps S 26 and S 27.

(14) $N_1$ is determined to be directly connected to an input variable in step S 28, and control is transferred to step S 30.

(15) In step S 30, as $N_1$ (in this case $I=N_1$) is not connected to the input of two or more gates as in the case of $N_3$, control is transferred to step S 32.

(16) In step S 32, $N_1$ is added to the end of the list FANOUT1LIST (the current value is $I=N_1$), and a mark is added to $N_1$.

(17) After returning to step S 26, the unretrieved label is selected for $I=N_2$ in step S 27.

(18) Since $N_2$ is determined to be directly connected to an input variable in step S 28, control is transferred to step S 30, and then to step S 32.

(19) In step S 32, $N_2$ is added to the end of the list FANOUT1LIST ($N_2$ is added after the above described $N_1$), and a mark is added to $N_2$.

(20) Control is returned to step S 26, and then transferred to step S 33 by a null set (that is, $N_1$ and $N_2$ are processed).

(21) As no values are set in the queue FANOUT2UP, control is transferred to step S 34 to provide a mark for a label $N_5$, and the label $N_3$ retained in the above described (8) is processed from step S 20 shown in FIG. 12.

(22) Control is transferred to step S 28 through steps S 21–S 27. Only a label $N_3$ indicates YES, and control is transferred to step S 30. The contents of the set S in step S 25 is $N_3$ exclusively.

(23) For a label $N_3$, the determination indicates YES in step S 30 (that is, a label $N_3$ is the input of two gates), and control is transferred to step S 31.

(24) In step S 31, $N_3$ is recorded to the queue FANOUT2UP (the current value is $I=N_3$), and to the end of a list ORDER if it is not contained in the list ORDER, and a mark is added to $N_3$.

(25) Thus, a null set arises in the input of the AND gate which outputs a label $N_7$. Therefore, control is transferred from step S 26 to step S 33.

(26) Since a value $N_3$ is set in the queue FANOUT2UP, control is transferred to step S 35.

(27) In step S 35, $N_1$ and $N_2$ recorded in a list FANOUT1LIST are connected to the list ORDER. That is, the above described labels $N_1$ and $N_3$ are connected to the point after the label $N_3$ is recorded in the list ORDER, and after a label having 1 gate which may already exist (which does not exist in this case). Thus, a label $N_3$ ranks first, a label $N_1$ ranks second, and a label $N_2$ ranks third. The above described list FANOUT1LIST is cleared with a mark added to the label $N_7$, and control is transferred to the process of a label $N_8$ starting from step S 21.

(28) When a label $N_8$ is processed, a label $N_6$ is processed as described above. Then, a label $N_3$ corresponding to the input of a NOT gate which outputs the label $N_6$ is checked. Since the label $N_3$ has already been processed, an actual process is not performed.

(29) Then, a label $N_4$ is processed.

(30) Thus, labels $N_3$, $N_1$, $N_2$, and $N_4$ are finally arranged in the queue ORDER.

As described above, the sequence of variables $X_3$, $X_1$, $X_2$, and $X_4$ corresponding to labels $N_3$, $N_1$, $N_2$, and $N_4$, respectively, is determined. The logical circuit shown in FIG. 14 represents the logical function $X_1 \times X_3 + X_2 \times X_3 + \overline{X_3} \times X_4$. In the cover of the logical function, three variables other than $X_3$, which has three 0s and/or 1s, have the same number of 0s and 1s. The sequence of the variables is determined to be the sequence detected in the circuit search with a variable at a deeper position assigned a higher priority as shown in FIG. 14, that is, $X_1$, $X_2$, and $X_4$. A plurality of input terminals of one gate are searched, starting from the upper input terminal. However, this doesn't mean that the search must be made sequentially from top to bottom, but that a plurality of input terminals as elements in the set S shown in step S 25 in FIG. 13 must be sequentially processed in the appropriate sequence.

FIG. 15 shows the content of each of the queues FANOUT2UP, FANOUTLIST, and ORDER among the processes as described by referring to FIGS. 7–9. NIL means a null set.

Figure 16A:
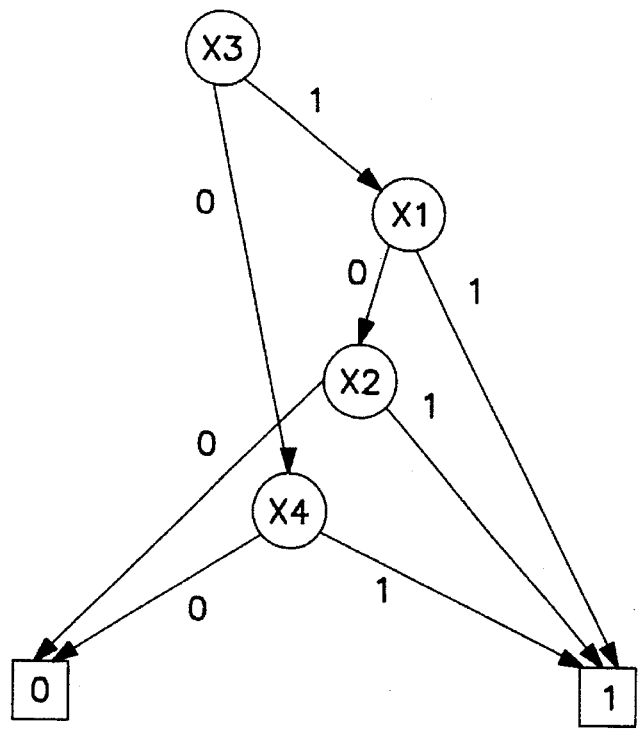
FIGS. 16A–16B show a view for explaining a dichotomy determination graph in the variable sequence determined for the logical circuit shown in FIG. 14.

FIG. 16A shows a dichotomy determination graph using the variable sequence $X_3$, $X_1$, $X_2$, and $X_4$ determined for the logical circuit shown in FIG. 14 in the variable sequence determining process shown in FIGS. 12 and 13. In this graph, the number of nodes is 4.

Figure 16B:
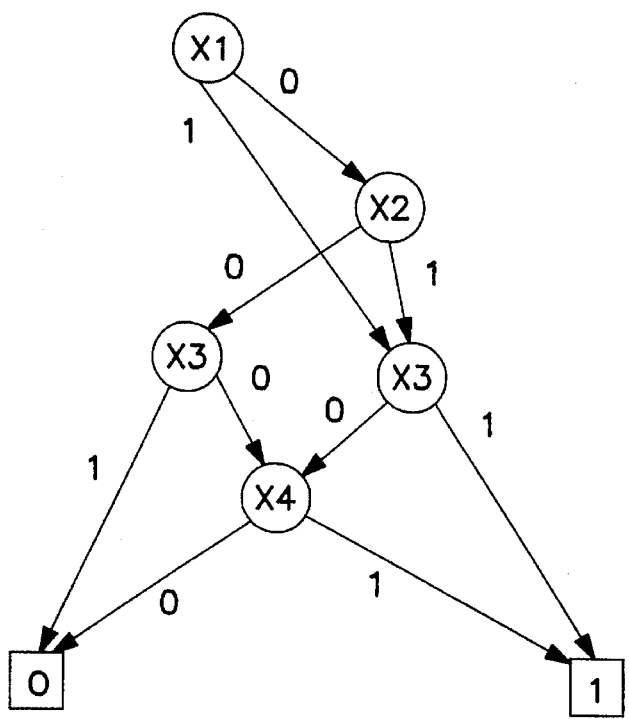

By contrast, FIG. 16B is a dichotomy determination graph in which the variable sequence $X_1$, $X_2$, $X_3$, and $X_4$ is determined simply, without the variable sequence determining method shown in FIGS. 12 and 13. In FIGS. 12 and 13, the number of nodes is 5 which is larger than that shown in FIG. 16A.

Figure 1:
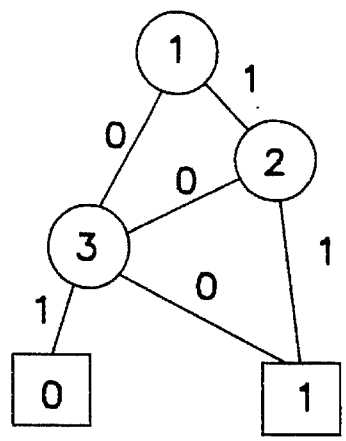
FIG. 1 (PRIOR ART) shows an example of a dichotomy determination graph.
Figure 2:
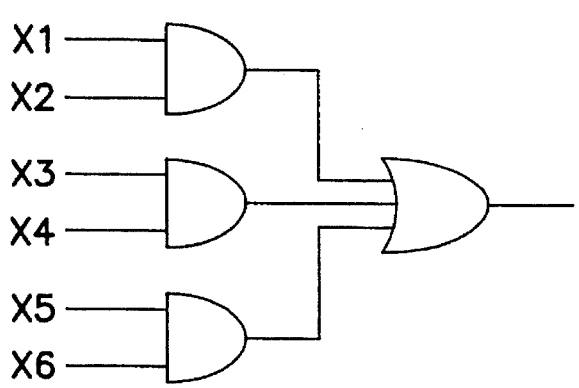
FIG. 2 (PRIOR ART) shows an example of a dichotomy determination graph when the optimum variable sequence is determined.
Figure 2:
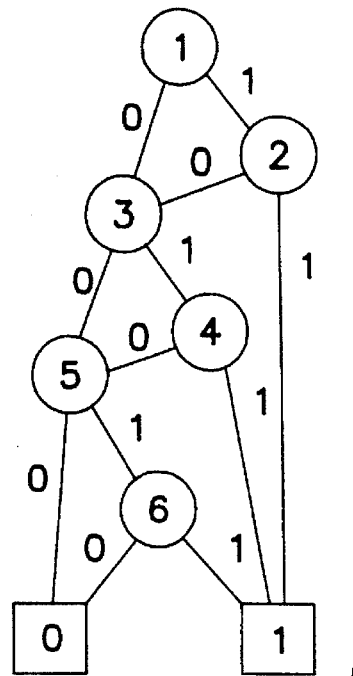
Figure 3:
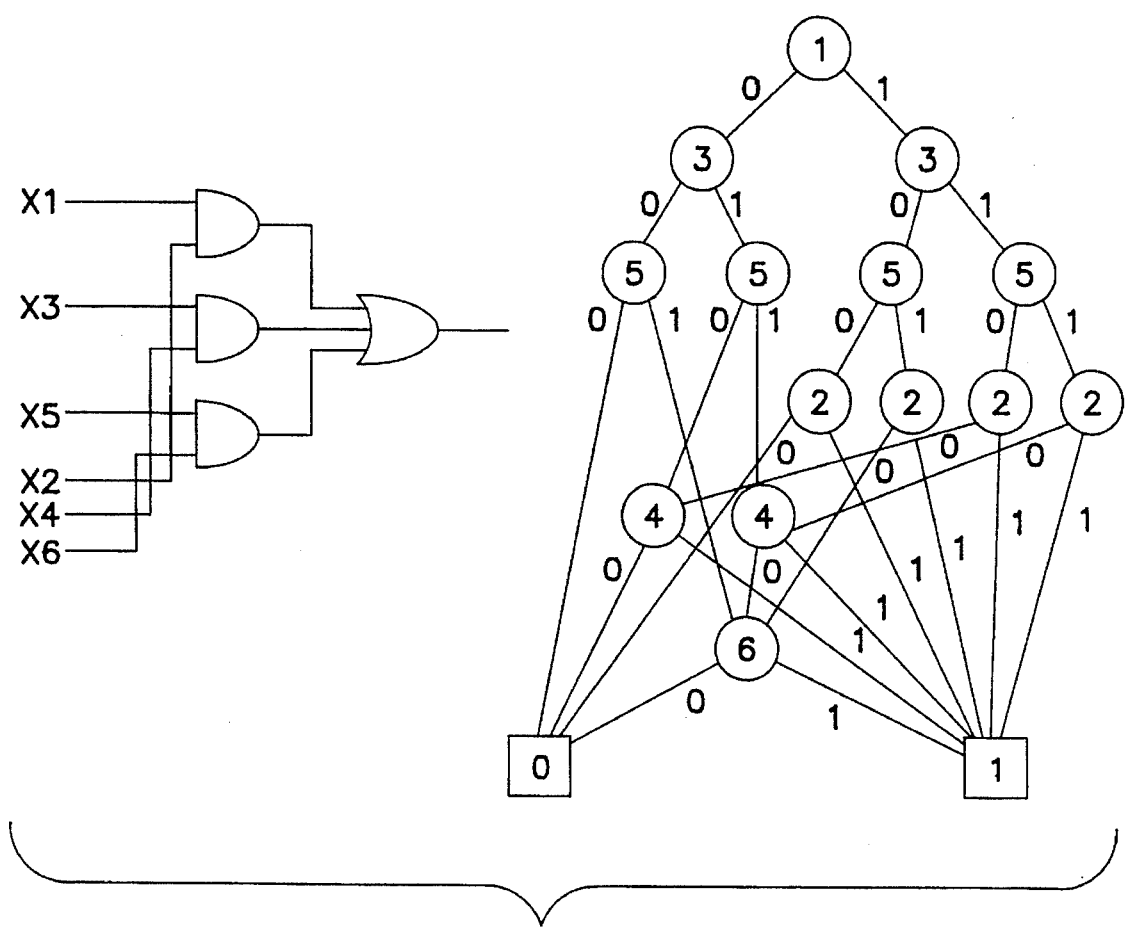
FIG. 3 (PRIOR ART) shows an example of a dichotomy determination graph when the worst variable sequence is determined.
Figure 17:
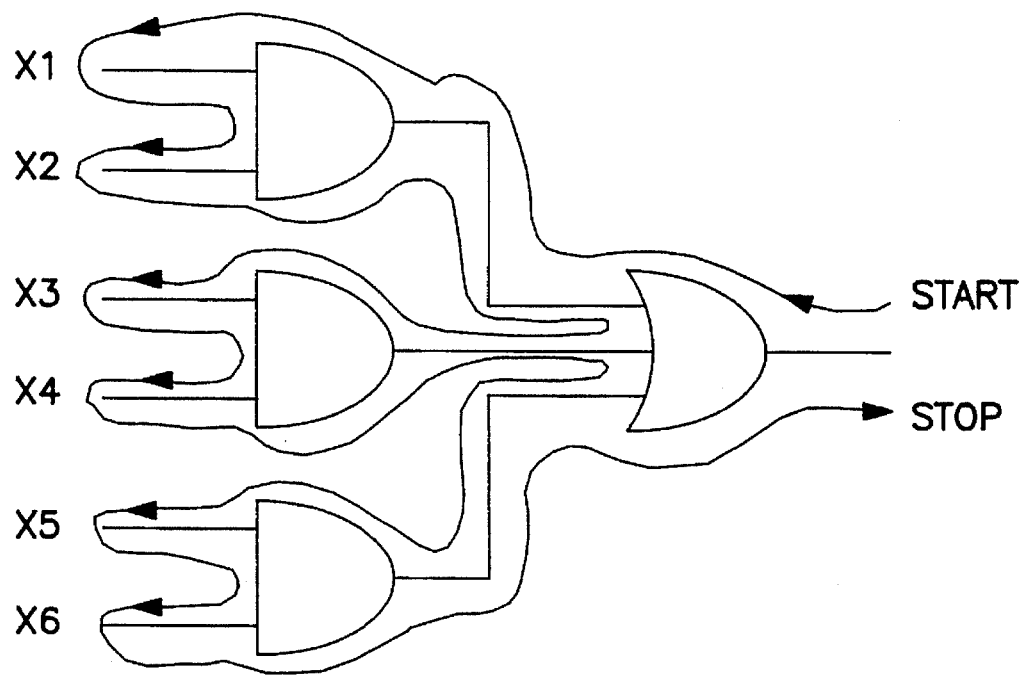
FIG. 17 shows another embodiment for explaining how to search a logical circuit and assign a higher priority to a variable at a deeper position.

FIG. 17 shows another embodiment for explaining the circuit search with a variable at a deeper position assigned a higher priority. FIG. 17 shows a logical circuit sample by referring to FIGS. 15 and 16. The same optimum sequence as that shown in FIG. 2 can be determined using the flowchart described in association with FIGS. 7 and 8.

Figure 18:
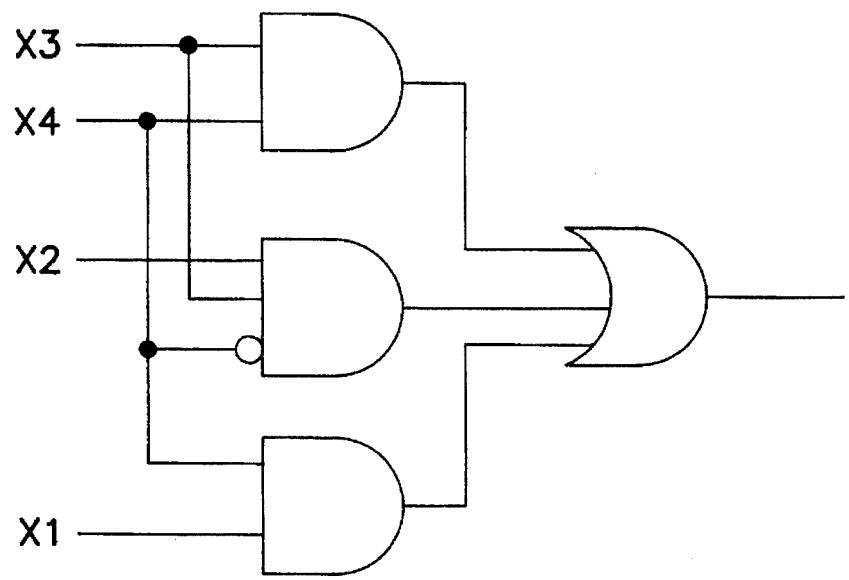
FIG. 18 shows a view for explaining the method of determining the two variables $X_1$ and $X_2$ shown in FIG. 5.

FIG. 18 is a view for explaining the method of determining the sequence of the variables $X_1$ and $X_2$, both indicating 1 as the number of 0s and 1s. FIG. 18 is generated by converting the cover representation shown in FIG. 5 to a logical circuit. The variable sequence $X_3$, $X_4$, $X_2$, and $X_1$ is determined by performing the variable sequence determining process explained in FIGS. 12 and 13. Thus, the sequence of the variables $X_1$ and $X_2$ is determined to be $X_2$ followed by $X_1$.

FIG. 19 shows a result of the application of the present invention in a bench mark circuit used in a study of a composite circuit. In FIG. 19, an original sequence means the sequence of variables derived when the present invention is not applied. It requires a larger number of nodes in its dichotomy determination graph than that derived with the present invention.

Figure 20A:
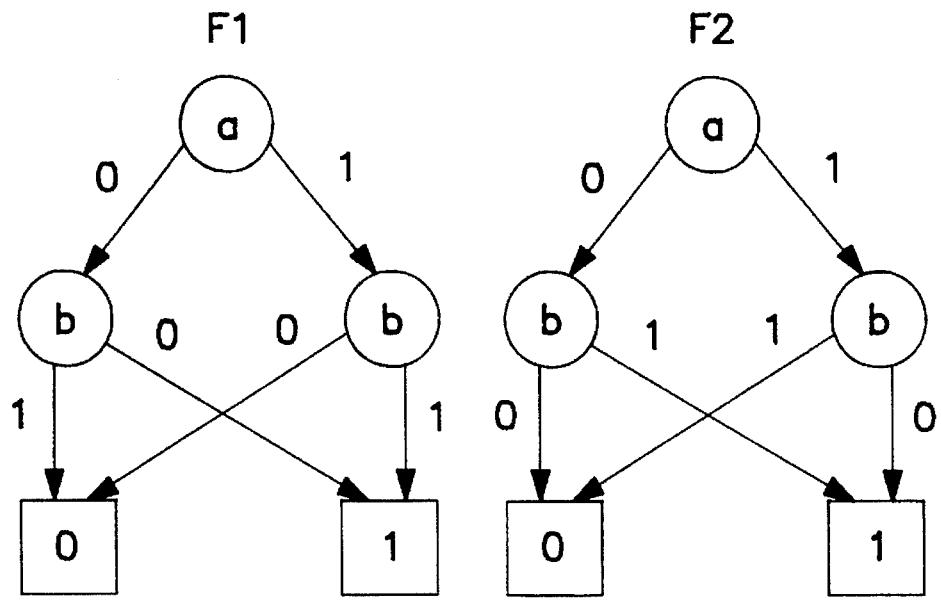
FIGS. 20A–20C show an embodiment of a shared dichotomy determination graph.
Figures 20B, 20C:
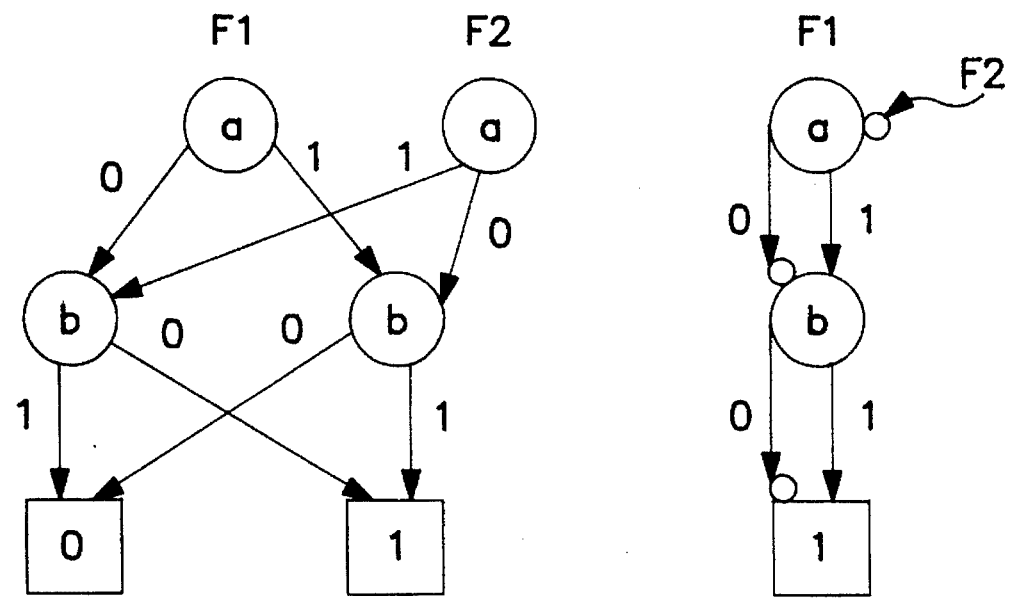

FIG. 20 is a sample of a shared dichotomy determination graph as an extended type dichotomy determination graph. The two dichotomy determination graphs shown in FIG. 20A, in which logical function $F1 = a \cdot b + \bar{a} \cdot \bar{b}$, and logical function $F2 = a \cdot \bar{b} + \bar{a} \cdot b$, can be extended to the shared dichotomy determination graph shown in FIG. 20B or to the shared dichotomy determination graph with a negative edge shown in FIG. 20C. The graph shown in FIG. 20B shares two dichotomy graphs of the same form for two logical functions $F_1$ and $F_2$ shown in FIG. 20A, and it is called a shared dichotomy determination graph.

In FIG. 20C, a specific attribute indicating negation of a function is represented in an edge (in this case, an edge is marked with a circle) when logical functions are negative to each other in the shared dichotomy determination graph shown in FIG. 20B. Thus, a graph can be generated in a simplified form. That is, since the functions $F_1$ and $F_2$ are negative to each other, the shared dichotomy determination graph with a negative edge is practically the same as the graph shown in FIG. 20B if $F_2$ is connected with a negative edge to a route node of $F_1$. The variable sequence determining method of the present invention can be applied to such an extended type dichotomy determination graph.

As described above, the present invention enables simplified representation of a dichotomy determination graph and can be used to efficiently perform various logical design supporting technologies such as logical collatings, logical verification, etc.

What is claimed is:

1. A variable sequence determining method for generating a dichotomy determination graph representing a logical function of a two-step logical circuit, comprising the steps of:

converting a logical expression of variables representing a logical function of said two-step logical circuit to a sum-of-products format;

for each of said variables in said logical expression converted to said sum-of-products format, determining an arithmetic sum of positive and negative product terms in said sum-of-products format;

prioritizing each of said variables by assigning a higher priority to said variable having a higher said arithmetic sum;

determining a sequence of said variables based on said prioritized variables; and generating said dichotomy determination graph based on said determined sequence of variables.

2. A variable sequence determining method according to claim 1, further comprising the steps of:

providing each row of a cover, represented in a matrix pattern having the same number of rows as said product terms in said sum-of-products format and having the same number of columns as said variables in said logical expression, to correspond to each of said product terms when said arithmetic sum is determined at said determining step;

generating said cover with three kinds of symbols as elements of said matrix pattern depending on whether one of said variables corresponding to each column is expressed as a positive or a negative value, or is not expressed at all; and setting a priority of said variables having a larger number of symbols corresponding to said positive or negative value of each said variable in said cover as said sequence determined in said determining step.

3. A variable sequence determining method according to claim 1, further comprising the steps of:

(S17) generating a logical circuit, wherein a product is expressed in a logical product gate and a sum is expressed in a logical sum gate, when at least two of said variables have the same number of said product terms determined at said determining step;

(S18) searching said logical circuit starting from an output side of said logical circuit with precedence to depth such that input variables connected to the same gate are assigned the closest priority, and an input variable used for a larger number of times is assigned a higher priority; and (S19) determining a sequence of said input variables determined in said searching step to be said sequence of variables having the same number of said product terms.

4. A variable sequence determining method according to claim 3, further comprising the steps of:

(S20) adding a label N to an output signal in said logical circuit or to the signal which is last kept in suspense, and (S21) determining whether or not said label exists in said searching step; and (S22) calling a procedure MAKE ORDER (N) when said label is determined to exist, and terminating said searching process when said label does not exist.

5. A variable sequence determining method according to claim 4, further comprising the steps of:

(S24) determining whether or not a mark indicating the termination of a process for said signal having a label N is added to said label N in said called said procedure MAKE ORDER (N), (S25) providing a set S of labels that are added to net signals each connected to the input of a gate for outputting a signal having a label N when said mark is determined as not added, and then (S26) determining whether or not said set S is a null set;

(S27) retrieving one of said labels from said set S when said set S is not a null set, setting said retrieved label as "I", and then (S28) determining whether or not said label I is connected to an input variable;

(S29) calling a procedure MAKE ORDER (I) when said label I is not connected to an input variable;

(S30) determining, when said label I is connected to an input variable, whether or not said label I is connected to a plurality of gates, (S32) adding said label N set as "I" last in a list FANOUT1 LIST when it is not connected to a plurality of gates, marking said label N, and repeating said processes (S26)–(S32);

(S31) setting said label N set as "I" in a queue FANOUT2 UP when said (S30) determination as to whether or not said 1 is connected to two or more gates indicates "yes", determining whether or not said label N set as "I" exists in a list ORDER, adding said label N last in said list ORDER when said label N set as "I" does not exist in said list ORDER, marking label N, and repeating said processes (S26)–(S31);

(S33) determining whether or not a value is already set in said queue FANOUT2 UP if said (S26) determination as to whether or not said label S is a null indicates "yes", (S34) marking said label N being processed when a value is not set, and repeating said processes (S20)–(S34);

(S35) inserting contents of said list FANOUT1 LIST immediately after the value set in said FANOUT2 UP in said list ORDER and after the label added to the signal connected to a single input variable if said (S33) determination as to whether or not a value is set in said queue FANOUT2 UP indicates "yes", adding a mark to a label N being processed, and repeating said processes (S20)–(S35); and repeating said processes (S20)–(S24) when said (S24) determination as to whether or not a mark is already added to said label N indicates "yes".

6. A variable sequence determining method according to claim 1, further comprising the steps of:

(S13) extending each of said product terms to the largest possible extent by said process of simplifying a logical expression in said sum-of-products format;

(S14) removing redundant product terms;

(S15) reducing each of said product terms as much as possible; and (S16) repeating said processes (S13)–(S15) until said logical expression cannot be reduced any more.

7. A variable sequence determining method according to claim 1, further comprising the step of:

generating said dichotomy determination graph using said variable sequence determining method as a shared dichotomy-determination graph having a position shared by the dichotomy determination graphs of two logical functions.

8. A variable sequence determining method for a dichotomy determination graph according to claim 7, further comprising the step of:

providing said shared dichotomy determination graph as a negative-edged dichotomy determination graph having a negative edge, said negative edge being an edge provided with a negative symbol.

* * * * *